US011737327B2

(12) United States Patent
Yi et al.

(10) Patent No.: US 11,737,327 B2
(45) Date of Patent: Aug. 22, 2023

(54) DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventors: Chujun Yi, Hubei (CN); Tao Chen, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 143 days.

(21) Appl. No.: 17/275,197

(22) PCT Filed: Dec. 18, 2020

(86) PCT No.: PCT/CN2020/137600
§ 371 (c)(1),
(2) Date: Mar. 11, 2021

(87) PCT Pub. No.: WO2022/095235
PCT Pub. Date: May 12, 2022

(65) Prior Publication Data
US 2022/0310742 A1   Sep. 29, 2022

(30) Foreign Application Priority Data

Nov. 6, 2020 (CN) .......................... 202011229232.6

(51) Int. Cl.
*G09G 3/3266* (2016.01)
*G09G 3/3291* (2016.01)
(Continued)

(52) U.S. Cl.
CPC ......... *H10K 59/131* (2023.02); *G09G 3/3266* (2013.01); *G09G 3/3291* (2013.01);
(Continued)

(58) Field of Classification Search
CPC ............. H01L 27/3276; H01L 27/3246; H01L 27/3272; H01L 27/3234; G09G 3/3266; G09G 3/3291
See application file for complete search history.

(56) References Cited

U.S. PATENT DOCUMENTS

2019/0206972 A1\* 7/2019 Park ..................... H01L 27/1225
2019/0288052 A1   9/2019 Choi et al.
(Continued)

FOREIGN PATENT DOCUMENTS

CN   107369690   11/2017
CN   108597374    9/2018
(Continued)

OTHER PUBLICATIONS

International Search Report and the Written Opinion dated Aug. 9, 2021 From the International Searching Authority Re. Application No. PCT/CN2020/137600 and Its Translation Into English. (19 Pages).

*Primary Examiner* — Kevin M Nguyen

(57) ABSTRACT

A display device and an electronic device are provided, and they shield the parasitic capacitance between the gate lead and the transparent wire by a shielding layer, so as to avoid the difference in parasitic capacitance from affecting a potential of the gate of the drive transistor to be varied and enhance the stability of the drive transistor as driving the light emitting device, so as to avoid the problem of uneven brightness when the light emitting device of the display device is displayed.

20 Claims, 7 Drawing Sheets

(51) Int. Cl.
*H10K 59/131* (2023.01)
*H10K 59/122* (2023.01)
*H10K 59/126* (2023.01)

(52) U.S. Cl.
CPC ......... *H10K 59/122* (2023.02); *H10K 59/126* (2023.02); *G09G 2320/0233* (2013.01)

(56) References Cited

U.S. PATENT DOCUMENTS

2020/0165824 A1* 5/2020 Kim .................... E04C 3/06
2020/0411622 A1* 12/2020 Sun .................. H01L 27/3258

FOREIGN PATENT DOCUMENTS

| CN | 109697958 | 4/2019 | |
|---|---|---|---|
| CN | 111833720 | 10/2020 | |
| CN | 112038381 | 12/2020 | |
| EP | 3282482 A1 * | 2/2018 | ........... G09G 3/3233 |

* cited by examiner

DISPLAY PANEL AND ELECTRONIC DEVICE

RELATED APPLICATIONS

This application is a National Phase of PCT Patent Application No. PCT/CN2020/137600 having International filing date of Dec. 18, 2020, which claims the benefit of priority of Chinese Patent Application No. 202011229232.6 filed on Nov. 6, 2020. The contents of the above applications are all incorporated by reference as if fully set forth herein in their entirety.

FIELD AND BACKGROUND OF THE INVENTION

The present disclosure relates to the technical field of display, and particularly, to a display device and an electronic device.

At present, in the design of active-matrix organic light emitting diode (AMOLED) display panels, it is a general trend to use a camera area under a screen for display. Among them, increasing a light transmittance of the camera area under the screen by electrically connecting transparent wires to pixels of the camera area under the screen is a common solution, thereby achieving the transparent display of the camera area under the screen. However, since a parasitic capacitance is formed between the transparent wires and gate leads when the transparent wires pass through the gate leads of the drive transistor of the pixel drive circuit. Due to uneven distribution of the transparent wires, there is a difference in parasitic capacitance between the transparent wires and the gate leads. The difference in parasitic capacitance results in display differences in corresponding pixels driven by the pixel drive circuit, thereby causing the problem of uneven display brightness in the organic light emitting diode display panel (Mura).

Therefore, it is necessary to provide a technical solution to solve the problem of uneven display brightness caused by the difference in parasitic capacitance between the transparent wires and the gate leads.

SUMMARY OF THE INVENTION

Technical Problems

The purpose of present disclosure is to provide a display device and an electronic device to solve the problem of uneven display brightness caused by the difference in parasitic capacitance between the transparent wires and the gate leads.

Technical Solutions

A display device with a light transmission area and a transition area located at a periphery of the light transmission area comprises:
 a plurality of light emitting devices disposed in the light transmission area;
 a plurality of pixel drive circuits disposed in the transition area, wherein each of the pixel drive circuits comprises:
  a drive transistor, wherein the drive transistor comprises a gate; and
  a gate lead disposed above the drive transistor, wherein the gate lead is electrically connected to the gate of the drive transistor;
 at least one transparent conductive layer disposed above the plurality of pixel drive circuits, wherein the at least one transparent conductive layer comprises a plurality of transparent wires, and the plurality of transparent wires are electrically connected to the plurality of light emitting devices and parts of the pixel drive circuits; and
 a shielding layer located between the gate lead and the at least one transparent conductive layer, wherein the shielding layer is disposed corresponding to the gate lead.

In the display device mentioned above, in a thickness direction of the display device, an orthographic projection of the gate lead on a substrate of the display device is located inside an orthographic projection of the shielding layer on the substrate of the display device.

In the display device mentioned above, the display device further comprises a metal grid configured to transmit a DC voltage signal. The metal grid and the shielding layer are disposed in the same layer and are disposed in the transition area. The metal grid disposed above the plurality of pixel drive circuits extends out of the shielding layer.

In the display device mentioned above, the display device further comprises a plurality of DC power signal lines. The plurality of DC power signal lines and the gate lead are disposed in the same layer, and the metal grid is electrically connected to the plurality of DC power signal lines.

In the display device mentioned above, the display device further comprises a main display area. The transition area is located between the main display area and the light transmission area. An insulation layer is provided between the plurality of DC power signal lines and the metal grid. A via hole is provided on the insulation layer corresponding to the main display area, and the metal grid is electrically connected to the plurality of DC power signal lines through the via hole.

In the display device mentioned above, the DC voltage signal is selected from one of an initialization signal or a DC power signal.

In the display device mentioned above, each of the pixel drive circuits further comprises a compensation transistor and an electrode plate. The electrode plate is disposed corresponding to the gate of the drive transistor, and the electrode plate is located between the gate lead and the gate of the drive transistor. One end of the gate lead is electrically connected to an active layer of the compensation transistor of the pixel drive circuit, and the other end of the gate lead is connected to the gate of the drive transistor at least through a via hole on the electrode plate.

In the display device mentioned above, parts of the transparent wires extend from the transition area to the light transmission area, and parts of the transparent wires are located in the transition area.

In the display device mentioned above, the display device further comprises a plurality of the transparent conductive layers, and the plurality of transparent wires are located at different ones of different transparent conductive layers.

In the display device mentioned above, a shape of the light transmission area is a circle. The plurality of pixel drive circuits form a plurality of pixel drive circuit islands, and the plurality of pixel drive circuit islands are disposed around the light transmission area. At least two of the pixel drive circuit islands have different numbers of the pixel drive circuits.

An electronic device comprises the display device described above and a photosensitive unit. The photosensitive unit is disposed corresponding to the light transmission area.

Beneficial Effects

The display device and the electronic device of the present disclosure may shield the parasitic capacitance between the gate lead and the transparent wire by a shielding layer, so as to avoid the difference in parasitic capacitance from affecting a potential of the gate of the drive transistor to be varied. Moreover, the display device and the electronic device of the present disclosure may enhance the stability of the drive transistor as driving the light emitting device to avoid the problem of uneven brightness when the light emitting device of the display device is displayed.

DESCRIPTION OF SPECIFIC EMBODIMENTS OF THE INVENTION

The technical solutions in the embodiments of the present disclosure will be clearly and completely described below in combination with the drawings in the embodiments of the present disclosure. Obviously, the described embodiments are only a part of the embodiments of the present disclosure, rather than all of the embodiments. Based on the embodiments in the present disclosure, all other embodiments obtained by those skilled in the art without creative work fall within the claimed scope of the present disclosure.

The present disclosure provides a display device. The display device may be a liquid crystal display device or an organic light emitting diode display device. Specifically, the display device is an organic light emitting diode display device.

Figure 1:
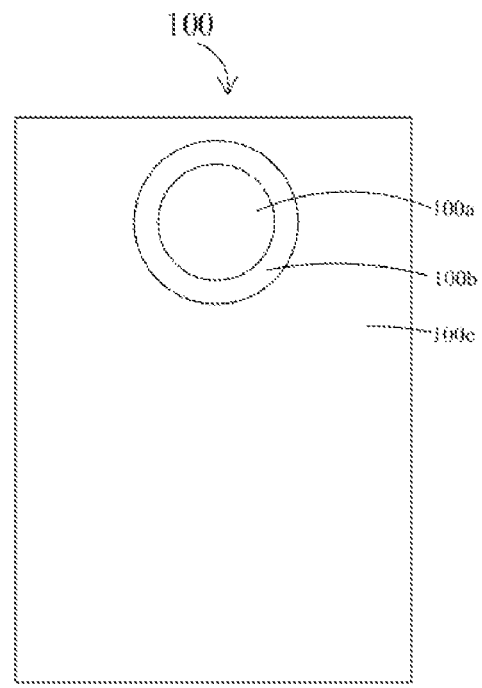
FIG. 1 is a schematic planar view of a planar structure of a display device according to one embodiment of the present disclosure.
Figure 2:
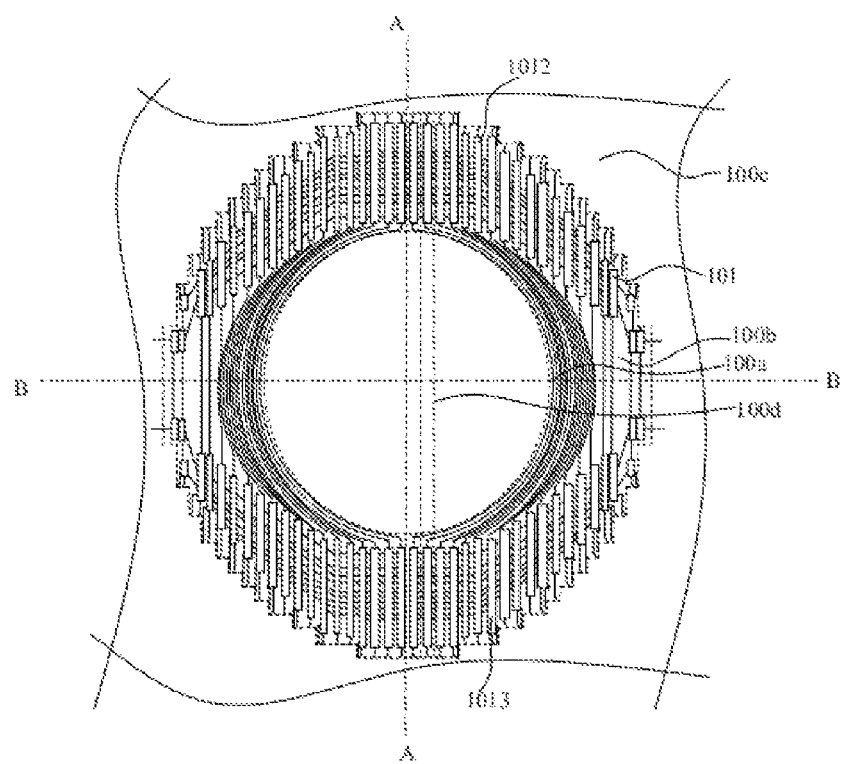
FIG. 2 is a partial enlarged schematic view of the display device shown in FIG. 1.
Figure 3:
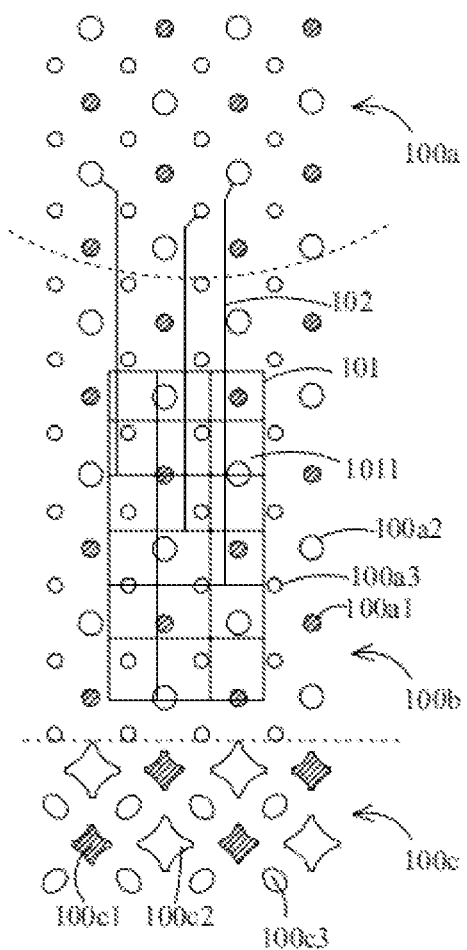
FIG. 3 is a partial schematic diagram of the display device shown in FIG. 2.

Please refer to FIGS. 1 and 2. FIG. 1 is a schematic plan view of a display device according to an embodiment of the application, FIG. 2 is a partial enlarged schematic view of the display device shown in FIG. 1, and FIG. 3 is a partial schematic diagram of the display device shown in FIG. The display device 100 has a light transmission area 100a, a main display area 100c, and a transition area 100b. The display device 100 includes a plurality of first display pixels, a plurality of first pixel drive circuits (not shown), a plurality of second display pixels, a plurality of pixel drive circuit islands 101 and a plurality of transparent wires 102.

Referring to FIG. 1 and FIG. 2, FIG. 1 is a schematic planar view of a planar structure of a display device according to one embodiment of the present disclosure, and FIG. 2 is a partial enlarged schematic view of the display device shown in FIG. 1. FIG. 3 is a partial schematic diagram of the display device shown in FIG. 2. The display device 100 has a light transmission area 100a, a main display area 100c, and a transition area 100b. The display device 100 comprises a plurality of first display pixels, a plurality of first pixel drive circuits (not shown), a plurality of second display pixels, a plurality of pixel drive circuit islands 101 and a plurality of transparent wires 102.

The transition area 100b is located at a periphery of the light transmission area 100a, and the transition area 100b is located between the main display area 100c and the light transmission area 100a. Both the main display area 100c and the transition area 100b are used for display. While the light transmission area 100a is used for display, the light transmission area 100a also has high light transmission characteristics. A light transmittance of the light transmission area 100a is greater than a light transmittance of the main display area 100c and a light transmittance of the transition area 100b. An area of the main display area 100c is larger than an area of the transition area 100b and an area of the light transmission area 100a. A shape of the light transmission area 100a is a circle, and a shape of the transition area 100b is a loop. The light transmission area 100a is symmetric with respect to a symmetry axis A-A and a symmetry axis B-B, and the symmetry axis A-A and the symmetry axis B-B are perpendicular to each other.

A plurality of first display pixels are evenly disposed in the main display area 100c, and each of the first display pixel comprises a first red sub-pixel 100c1, a first green sub-pixel 100c3, and a first blue sub-pixel 100c2. The first red sub-pixel 100c1, the first green sub-pixel 100c3, and the first blue sub-pixel 100c2 are distributed in the main display area 100c based on a Pentile design. A shape of the first green sub-pixel 100c3 is an ellipse shape, a shape of the first red sub-pixel 100c1 is an octagonal shape and a shape of the first blue sub-pixel 100c2 is an octagonal shape.

A plurality of first pixel drive circuits are also disposed in the main display area 100c. One of first pixel drive circuits correspondingly drives one sub-pixel (one of the first red sub-pixel 100c1, the first green sub-pixel 100c3, and the first blue sub-pixel 100c2) of the main display area 100c to emit light. Each of first pixel drive circuits comprises a plurality of metal film layers, and the plurality of first pixel drive circuits are arranged in an array in the main display area 100c, resulting in low light transmittance of the main display area 100c. All of the first red sub-pixel 100c1, the first green sub-pixel 100c3, and the first blue sub-pixel 100c2 comprise a light emitting device, and the light emitting device is an organic light emitting diode.

A plurality of second display pixels are evenly disposed in the display light transmission area 100a and the transition area 100b. Each of the second display pixels comprises a second red sub-pixel 100a1, a second green sub-pixel 100a3, and a second blue sub-pixel 100a2. The second red sub-pixel 100a1, the second green sub-pixel 100a3, and the second blue sub-pixel 100a2 are distributed in the display light transmission area 100a and the transition area 100b. All shapes of the second red sub-pixel 100a1, the second green sub-pixel 100a3, and the second blue sub-pixel 100a2 are circle. All of the second red sub-pixel 100a1, the second green sub-pixel 100a3, and the second blue sub-pixel 100a2 comprise a light emitting device. The light emit device is an organic light emitting diode. Each organic light emit diode comprises an anode, a cathode, and an organic light emitting layer disposed between the anode and the cathode.

A size of the first red sub-pixel 100c1 is greater than a size of the second red sub-pixel 100a1, a size of the first green sub-pixel 100c3 is greater than a size of the second green sub-pixel 100a3, and a size of the first blue sub-pixel 100c2 is greater than a size of the second blue sub-pixel 100a2 is to ensure that the light transmission area 100a has high light transmittance. the size of the sub-pixels becomes smaller from the main display area 100c to the transition area 100b.

Since the size of the second red sub-pixel 100a1 is different from the size of the first red sub-pixel 100c1, drive powers of corresponding drive circuits are also different. Similarly, a drive power of the drive circuit of the first green sub-pixel 100c3 is also different from a drive power of the drive circuit of the second green sub-pixel 100a3, and a drive power of the drive circuit of the first blue sub-pixel 100c2 is different from a drive power of the drive circuit of the second blue sub-pixel 100a2. Therefore, the first pixel drive circuit may only be used to drive the red sub-pixel 100c1, the first green sub-pixel 100c3, and the first blue sub-pixel 100c2 of the main display area 100c, and may not be used to drive the transition area 100b and the second red sub-pixel 100a1, the second green sub-pixel 100a3, and the second blue sub-pixel 100a2 of the light transmission area 100a.

Referring to FIG. 2 and FIG. 3, a plurality of pixel drive circuit islands 101 are disposed in the transition area 100b. Each pixel drive circuit island 101 comprises a plurality of second pixel drive circuits 1011 arranged in an array, and each pixel drive circuit island 101 comprises second pixel drive circuits 1011 with m rows and n columns, m is greater than or equal to 2, and n is greater than or equal to 2. That is, each pixel drive circuit island 101 has a strip shape. The second pixel drive circuit 1011 of the plurality of pixel drive circuit islands 101 is used to drive the plurality of second display pixels to emit light. That is, while the second pixel drive circuit 1011 of the plurality of pixel drive circuit islands 101 is used to drive the second display pixel in the transition area 100b to emit light, the second pixel drive circuit 1011 of the plurality of pixel drive circuit islands 101 is also used to drive the second display pixel in the light transmitting area 100a to emit light, so as to prevent the light transmission area 100a from being provided with the pixel drive circuit, and to prevent the metal film layer of the pixel drive circuit from affecting the light transmittance of the light transmission area 100a, thereby further enhancing the light transmittance of the light transmission area 100a. The plurality of second pixel drive circuits 1011 constitute a plurality of pixel drive circuit islands 101, which is beneficial to reduce the space occupied by the plurality of second pixel drive circuits 1011 and is beneficial to achieve the drive of the second display pixels corresponding to the display light transmission area 100a by the second pixel drive circuit 1011. However, the wirings electrically connected to the second pixel drive circuit 1011 are concentrated in the area where the pixel drive circuit island 101 is arranged. The pixel drive circuit island 101 refers to a plurality of second pixel drive circuits 1011 arranged in an island shape, and a distance between two adjacent pixel drive circuit islands 101 is greater than a distance between two adjacent second pixel drive circuits 1011 of the same pixel drive circuit island 101.

Different from the main display area 100c, one second pixel drive circuit 1011 is used to drive at least two of the plurality of the second red sub-pixels 100a1, the plurality of the second green sub-pixels 100a3, and the plurality of the second blue sub-pixels 100a2 to reduce a number of second pixel drive circuits 1011 and reduce a space occupied by pixel drive circuit islands 101, thereby allowing a size of the light transmission area 100a to be increased or the transition area 100b to have more space without the pixel drive circuit islands 101. The second pixel drive circuit 1011 may be used to drive a plurality of second red sub-pixels 100a1, a plurality of second green sub-pixels 100a3, and a plurality of second blue sub-pixels 100a2 to emit sub-pixels with the same color light and/or emit sub-pixels with different color lights. In the light transmission area 100a, the sub-pixels driven by the same second pixel drive circuit 1011 are electrically connected by transparent wires.

Specifically, two second red sub-pixels 100a1 are driven by the same second pixel drive circuit 1011, two second blue sub-pixels 100a2 are driven by the same second pixel drive circuit 1011, and four second green sub-pixels 100a3 are driven by the same second pixel drive circuit 1011.

As shown in FIG. 2, a plurality of pixel drive circuit islands 101 are arranged around the light transmission area 100a, and the numbers of the second pixel drive circuits 1011 in at least two of the pixel drive circuit islands 101 are different, so that at least two of the pixel drive circuit islands 101 have different drive numbers of corresponding sub-pixels. When the light transmission area 100a is a circle shape and part of the second pixel drive circuit 1011 of each pixel drive circuit island 101 is used to drive corresponding sub-pixels, the change in the number of sub-pixels corresponding to each pixel drive circuit island 101 in the light transmission area 100a may be displayed.

The plurality of pixel drive circuit islands 101 comprises a first group of pixel drive circuit islands 1012 (pixel drive circuit islands 101 above a symmetry axis B-B) and a second group of pixel drive circuit islands 1013 (pixel drive circuit islands 101 below the symmetry axis B-B). The pixel drive circuit islands 101 of the first group of pixel drive circuit islands 1012 and the pixel drive circuit islands 101 of the second group of pixel drive circuit islands 1013 are symmetrically disposed with respect to the symmetry axis B-B. The pixel drive circuit islands 101 of the first group of pixel drive circuit islands 1012 are symmetrically disposed with respect to the symmetry axis A-A, and the pixel drive circuit islands 101 of the second group of pixel drive circuit islands 1012 are symmetrically disposed with respect to the symmetry axis A-A.

The number of second pixel drive circuits 1011 of some of the pixel drive circuit islands 101 in the first group of pixel drive circuit islands 1012 decreases from close to the symmetry axis A-A to far away from the symmetry axis A-A. Correspondingly, the number of second pixel drive circuits 1011 of some of the pixel drive circuit islands 101 in the second group of pixel drive circuit islands 1013 decreases from close to the symmetry axis A-A to far away from the symmetry axis A-A. One pixel drive circuit island 101 of the first group of pixel drive circuit islands 1012 and a corresponding pixel drive circuit island 101 of the second group of pixel drive circuit islands 1013 drive the sub-pixels between the two located areas and the light transmission area 100a, such as sub-pixels in the area 100d. Each pixel drive circuit islands 101 of the first group of drive circuit islands 1012 and the second group of drive circuit islands 1013 is used to drive the sub-pixels in the corresponding area of the pixel drive circuit island 101, and also drive the sub-pixels in a corresponding area between the pixel drive circuit island 101 and corresponding pixel drive circuit island of the second group of pixel drive circuit islands 1013.

As shown in FIG. 3, in order to enhance the light transmittance of the light transmission area 100a, a plurality of second pixel drive circuits 1011 and the second red sub-pixel 100a1, the second blue sub-pixel 100a2, and the second green sub-pixel 100a1 of the light transmission area 100a are electrically connected to a plurality of transparent wires 102. Since the plurality of second pixel drive circuits 1011 are concentratedly distributed in an island shape, a number of transparent wires 102 corresponding to the pixel drive circuit island 101 is large, and some of the transparent wires 102 may be overlapped with the gate lead electrically connected to the gate of the drive transistor of the second pixel drive circuit 1011 of the pixel drive circuit island 101, and the transparent wires 102 are densely distributed and different, resulting in differences in the overlapping areas of different gate leads and the transparent wires 102.

Figure 4:
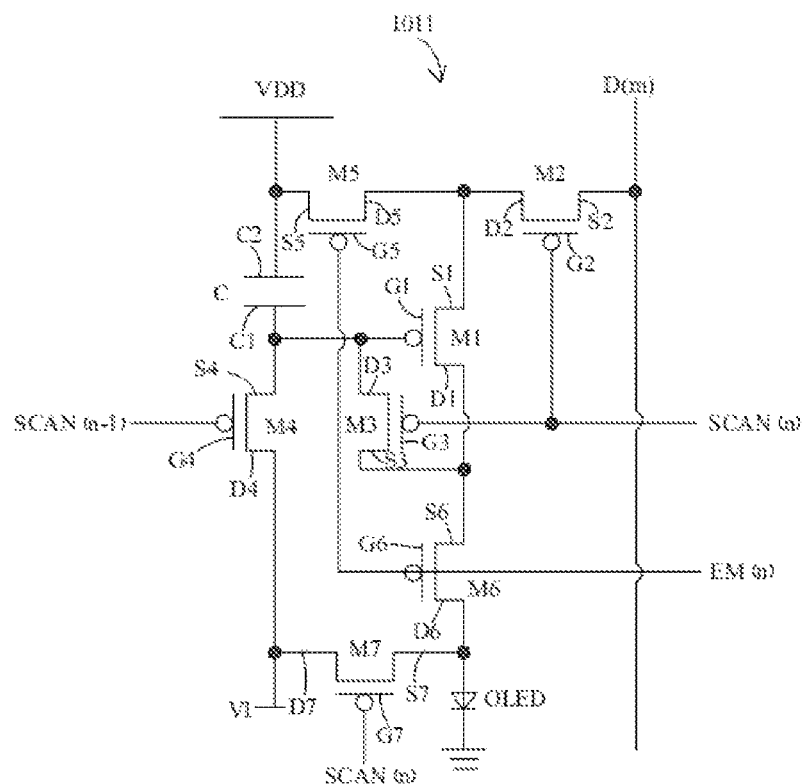
FIG. 4 is an equivalent circuit diagram of a second pixel drive circuit shown in FIG. 3.
Figure 5:
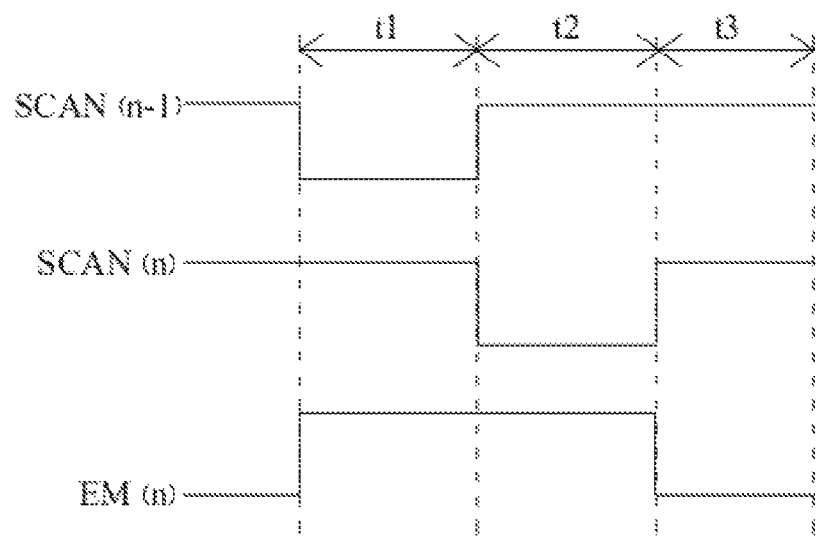
FIG. 5 is a drive timing diagram corresponding to the second pixel drive circuit shown in FIG. 4.
Figure 6:
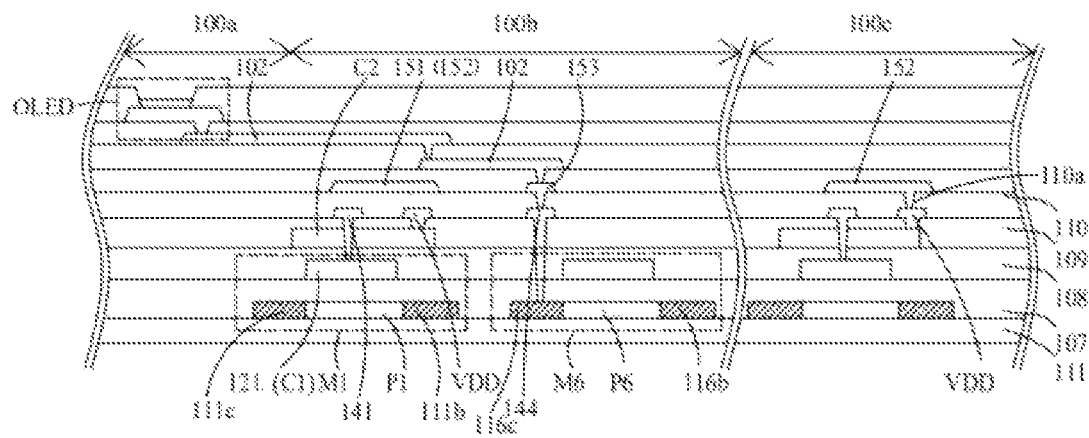
FIG. 6 is a cross-sectional view of the display device.

Please refer to FIG. 4 to FIG. 6. FIG. 4 is an equivalent circuit diagram of a second pixel drive circuit shown in FIG. 3, FIG. 5 is a drive timing diagram corresponding to the second pixel drive circuit shown in FIG. 4, and FIG. 6 is a cross-sectional view of the display device.

Each second pixel drive circuit 1011 comprises a drive transistor M1, a switching transistor M2, a compensation transistor M3, an initialization transistor M4, a first light emitting control transistor M5, a second light emitting control transistor M6, an anode reset transistor M7, and a capacitor C. The drive transistor M1, the switching transistor M2, the compensation transistor M3, the initialization transistor M4, the first light emitting control transistor M5, the second light emitting control transistor M6, and the anode reset transistor M7 are all P-type transistors.

The display device 100 further comprises a plurality of wirings electrically connected to the second pixel drive circuit 1011, and the plurality of wirings comprises a $n-1^{th}$ level scan signal line SCAN(n-1) and a $n^{th}$ level provided in the transition area 100b. a $n^{th}$ level scan signal line SCAN (n), a data line D(m), an initialization signal line VI, a DC power signal line VDD, and a $n^{th}$ level light emitting control signal line EM(n). A $n-1^{th}$ level scan signal line SCAN (n-1) is used to transmit the $n^{-1}$ level scan signal. The $n^{th}$ level scan signal line SCAN(n) is used to transmit the $n^{th}$ level scan signal. The data line D(m) is used to transmit data signals. The DC power signal line VDD is used to transmit the DC power signal. The $n^{th}$ level light emitting control signal line EM(n) is used to transmit the $n^{th}$ level light emitting control signal. The initialization signal line VI transmits the initialization signal or the reset signal.

A gate G1 of the drive transistor M1 is connected to a first electrode plate C1 of the capacitor C, a drain D3 of the compensation transistor M3, and a source S4 of the initialization transistor M4. A source S1 of the drive transistor M1 is connected to the DC power signal line VDD by the first light emitting control transistor M5. The source S1 of the drive transistor M1 is connected to the data line D(m) by the switching transistor M2. A drain D1 of the drive transistor M1 is connected to the light emitting device OLED by the second light emitting control transistor M6. The switching transistor M2 is turned on, and the drive transistor M1 receives the data signal transmitted by the data line D(m) and provides a driving current to the light emitting device OLED.

A gate G2 of the switching transistor M2 is connected to the $n^{th}$ level scan signal line SCAN(n), a source S2 of the switching transistor M2 is connected to the data line D(m), and a drain D2 of the switching transistor M2 is connected to the source S1 of the drive transistor M1. The drain D2 of the switching transistor M2 is also connected to the DC power signal line VDD by the first light emitting control transistor M5. The switching transistor M2 is turned on or turned off according to the $n^{th}$ level scan signal transmitted by the $n^{th}$ level scan signal line SCAN(n), and controls whether the data signal transmitted by the data line D(m) is written to the source S1 of the drive transistor M1.

A gate G3 of the compensation transistor M3 is connected to the $n^{th}$ scan signal line SCAN(n), a source S3 of the compensation transistor M3 is connected to the drain D1 of the drive transistor M1, and the source S3 of the compensation transistor M3 is also connected to the light emitting device OLED by the second light emitting control transistor M6. A drain D3 of the compensation transistor M3 is connected to the gate G1 of the drive transistor M1, the source S4 of the initialization transistor M4, and the first electrode plate C1 of the capacitor C. The compensation transistor M3 is turned on according to the $n^{th}$ level scan signal transmitted by the $n^{th}$ level scan signal line SCAN(n) and is electrically connected to the gate G1 of the drive transistor M1 and the drain D1 of the drive transistor M1.

A gate G4 of the initialization transistor M4 is connected to the $n-1^{th}$ level scan signal line SCAN (n-1), a drain D4 of the initialization transistor M4 is connected to a drain D7 of the anode reset transistor M7 and the initialization signal line VI. The source S4 of the initialization transistor M4 is connected to the gate G1 of the drive transistor M1, the drain D3 of the compensation transistor M3, and the first electrode plate C1 of the capacitor C. The initialization transistor M4 is turned on or turned off according to the $n-1^{th}$ level scan signal transmitted by the $n-1^{th}$ level scan signal line SCAN (n-1), and controls whether the initialization signal transmitted by the initialization signal line VI is written to the gate G1 of the drive transistor M1.

A gate G5 of the first light emitting control transistor M5 is connected to the $n^{th}$ level light emitting control signal line EM(n), and a source S5 of the first light emitting control transistor M5 is connected to the DC power signal line VDD and the second electrode plate C2 of the capacitor C. A drain D5 of the first light emitting control transistor M5 is connected to the source S1 of the drive transistor M1 and the drain D2 of the switching transistor M2. The first light emitting control transistor M5 is turned on or turned off according to the $n^{th}$ level light emitting control signal transmitted by the $n^{th}$ level light emitting control signal line EM(n), and controls whether the DC power signal transmitted by the DC power signal line VDD is written to the source S1 of the drive transistor M1.

A gate G6 of the second light emitting control transistor M6 is connected to the $n^{th}$ level light emitting control signal line EM(n), a source S6 of the second light emitting control transistor M6, the drain D1 of the drive transistor M1, and the source S3 of the compensation transistor M3. A drain D6 of the second light emitting control transistor M6 is connected with the anode of the light emitting device OLED. The second light emitting control transistor M6 is turned on or turned off according to the $n^{th}$ level light emitting control signal transmitted by the $n^{th}$ level light emitting control signal line EM(n), and controls whether the driving current flows into the light emitting device OLED.

A gate G7 of the anode reset transistor M7 is connected to the $n^{th}$ level scan signal line SCAN(n), a drain D7 of the anode reset transistor M7 is connected to the drain D4 of the initialization transistor M4 and the initialization signal line VI, and a source S7 of the anode reset transistor M7 is connected to the anode of the light emitting device OLED and the drain D6 of the second light emitting control transistor M6. The anode reset transistor M7 is turned on or turned off according to the $n^{th}$ level scan signal transmitted by the $n^{th}$ level scan signal line SCAN(n), and controls whether the initialization signal transmitted by the initialization signal line VI is written to the anode of the light emitting device OLED.

The first electrode plate C1 of the capacitor C is connected to the gate G1 of the drive transistor M1, the source S4 of the initialization transistor M4, and the drain D3 of the compensation transistor M3. The second electrode plate C2 of the capacitor C is connected to the DC power signal line VDD and the source S5 of the first of first light emitting control transistor M5. The capacitor C is used to maintain a voltage of the gate of the drive transistor M1 when the drive transistor M1 drives the light emitting device OLED to emit light.

Referring to FIG. 5, in the initialization stage t1, the n−1$^{th}$ level scan signal line SCAN (n−1) inputs a low level of the n−1$^{th}$ level scan signal. The initialization transistor M4 is turned on, and the initialization signal transmitted by the initialization signal line VI is transmitted to the gate G1 of the drive transistor M1 to initialize the gate G1 of the drive transistor M1. The n$^{th}$ level scan signal line SCAN(n) inputs a high level of the n$^{th}$ level scan signal, the switching transistor M2, the compensation transistor M3, and the anode reset transistor M7 are all turned off. The n$^{th}$ level light emitting control signal line EM(n) inputs a high-level of the n$^{th}$ level light emitting control signal, and the first light emitting control transistor M5 and the second light emitting control transistor M6 are both turned off.

In the threshold voltage compensation and data voltage writing stage t2, the n−1$^{th}$ level scan signal line SCAN(n−1) inputs a high level of the n−1$^{th}$ level scan signal. The initialization transistor M4 is turned off. The n$^{th}$ level scan signal line SCAN(n) inputs a low level of the n$^{th}$ level scan signal. The switching transistor M2, the compensation transistor M3 and the anode reset transistor M7 are all turned on, and the turned on switching transistor M2 writes the data signal transmitted by the data line D(m) to the source of the drive transistor M1. The turned-on compensation transistor M3 is electrically connected to the gate G1 of the drive transistor M1 and the drain D1 of the drive transistor M1. The turned-on anode reset transistor M7 transmits the initialization signal transmitted by the initialization signal line VI to the anode of the light emitting device OLED. The n$^{th}$ level light emitting control signal line EM(n) inputs a high-level of the n$^{th}$ level light emitting control signal, and both the first light emitting control transistor M5 and the second light emitting control transistor M6 are turned off. At this stage, the threshold voltage of the drive transistor M1 is compensated, the data signal is written, and the anode of the light emitting device OLED is initialized.

In the light emitting phase t3, the n−1$^{th}$ level scan signal line SCAN(n−1) inputs a high level of the n−1$^{th}$ level scan signal. The initialization transistor M4 is turned off. The n$^{th}$ level scan signal line SCAN(n) inputs a high level of the n$^{th}$ level scan signal, the switching transistor M2, the compensation transistor M3, and the anode reset transistor M7 are all turned off. The n$^{th}$ level light emitting control signal line EM(n) inputs a low level of the n$^{th}$ level light emitting control signal. The first light emitting control transistor M5 and the second light emitting control transistor M6 are both turned on. The drive transistor M1 is turned on and outputs a driving current. The light emitting device OLED emits light.

As shown in FIG. 6, the display device 100 comprises a substrate 111. Each second pixel drive circuit 1011 comprises a drive transistor M1, a capacitor, a compensation transistor M3, and a second light emitting control transistor M6. The display device 100 further comprises at least one transparent conductive layer disposed in the transition area 100b and the light transmission area 100a. The at least one transparent conductive layer is located above the plurality of pixel drive circuit islands 101, and the at least one transparent conductive layer comprises a plurality of transparent wires 102. The second pixel drive circuit 1011 and at least one transparent conductive layer are both disposed on the substrate 111. The substrate 111 may be a flexible substrate or a glass substrate.

The drive transistor M1 comprises a drive active layer P1 and a drive gate 121, and opposite ends of the drive active layer P1 are doped to form a drive source 111b and a drive drain 111c, respectively. The second light emitting control transistor M6 comprises a second light emitting control active layer P6 and a second light emitting control gate. The opposite ends of the second light emitting control active layer P6 are doped to form a second light emitting control source 116b and a second light emitting control drain 116c, respectively. The drive active layer P1 and the second light emitting control active layer P6 are disposed in the same layer. The drive gate 121 and the second light emitting control gate are disposed in the same layer. The compensation active layer of the compensation transistor M3 and the drive active layer P1 are disposed in the same layer, and the compensation gate of the compensation transistor M3 and the drive gate 121 are disposed in the same layer. The capacitor C comprises a first electrode plate C1 and a second electrode plate C2, and the first electrode plate C1 is the drive gate 121.

The drive active layer P1 is disposed on the substrate 111, the drive gate 121 is disposed above the drive active layer P1, and a first insulation layer 107 is disposed between the drive active layer P1 and the drive gate 121. The second electrode plate C2 is disposed directly above the first electrode plate C1, and a second insulation layer 108 is disposed between the drive gate 121 and the second electrode plate C2. The gate lead 141 is located above the drive transistor M1, and the gate lead 141 is located above the second electrode plate C2. A third insulation layer 109 is disposed between the gate lead 141 and the second electrode plate C2. One end of each gate lead 141 is electrically connected to the compensation active layer of the compensation transistor M3 of the second pixel drive circuit 1011 through a via hole penetrating the first insulation layer 107, the second insulation layer 108 and the third insulation layer 109. The other end of the gate lead 141 is electrically connected to the drive gate 121 through a via hole penetrating the third insulation layer 109, the second electrode plate C2 and the second insulation layer 108. The gate lead 141, a first anode lead 144, and the DC power signal line VDD are located in the same film layer. The DC power signal line VDD inputs and transmits a DC power signal and is electrically connected to the second electrode plate C2 through a via hole penetrating the third insulation layer 109. The first anode lead 144 is electrically connected to the second light emitting control drain 116c of the second light emitting control transistor M6 through a via hole penetrating the third insulation layer 109, the second insulation layer 108, and the first insulation layer 107. The second anode lead 153 is located directly above the first anode lead 144. There is a fourth insulation layer 110 between the second anode lead 153 and the first anode lead 144. The second anode lead 153 is connected to the first anode lead 144 through a via hole penetrating the fourth insulation layer 110. A plurality of transparent wires 102 are located above the second anode lead 153. A plurality of transparent wires 102 are electrically connected with the second anode lead 153, and a plurality of transparent wires 102 are electrically connected with the anode of the light emitting device OLED, so that the plurality of transparent wires 102 are electrically connected to the plurality of light emitting devices OLED and part of the second pixel drive circuit 1011. The first insulation layer 107, the second insulation layer 108 and the third insulation layer 109 are all inorganic insulation layers. The materials of the first insulation layer 107, the second insulation layer 108 and the third insulation layer 109 are selected from at least one of silicon nitride and silicon oxide. silicon. The fourth insulation layer 110 is an organic insulation layer, and the material of the organic insulation layer is selected from polyimide.

The plurality of transparent wires 102 are disposed on the plurality of transparent conductive layers to increase the layout space of the transparent wires 102 and avoid short circuits happened between the transparent wires 102 due to the small layout space of the transparent wires 102. The material of the transparent wire 102 is at least one of indium tin oxide or indium zinc oxide. An organic insulation layer is disposed between the transparent wires 102 of adjacent film layers.

The display device comprises a shielding layer 151 disposed in the transition area 100 b. The shielding layer 151 is located between the plurality of gate leads 141 and at least one transparent conductive layer, and the shielding layer 151 is disposed corresponding to the gate lead 141. The shielding layer 151 shields the parasitic capacitance between the gate lead 141 and the transparent wire 102 to prevent the parasitic capacitance from causing the gate potential of the drive transistor M1 to be unstable, and to avoid parasitic capacitance differences that cause parasitic capacitance to have a greater impact on the gate potential of the drive transistor M1, enhancing the working stability of the drive transistor M1, and avoiding the problem of uneven display in the light transmission area 100a of the display device.

In a thickness direction of the display device 100, an orthographic projection of the plurality of gate leads 141 on the substrate 111 of the display device 100 is located inside an orthographic projection of the shielding layer 151 on the substrate 111 of the display device 100, allowing an area of the shielding layer 151 corresponding to the gate lead 141 larger than an area of the gate lead 141, so that the shielding layer 151 completely shields corresponding gate lead 141 and completely avoids parasitic capacitance generated between the plurality of gate leads 141 and the plurality of transparent wires 102.

The display device 100 further comprises a metal grid 152 configured to transmit DC voltage signals. The shielding layer 151 and the metal grid 152 are disposed in the same layer. Part of the metal grid 152 is disposed directly above the plurality of pixel drive circuit islands 101, the part of the metal grid 152 is disposed in the main display area 100c. The metal grid 152 of the main display area 100c is electrically connected to the metal grid 152 above the plurality of pixel drive circuit islands 101 are directly. The metal grid 152 is electrically connected to the DC power signal line VDD to reduce the drop of resistance voltage of the DC power signal transmitted by the DC power signal line VDD. The metal grid 152 has a grid shape. The material of the metal grid 152 is selected from at least one of molybdenum, aluminum, titanium, and copper.

The metal grid 152 disposed in the transition area 100b and above the plurality of second pixel drive circuits 1011 extends out of the shielding layer 151, so that the shielding layer 151 transmits a fixed voltage signal, and the Parasitic capacitance is formed between the shielding layer 151 and the gate lead 141. However, the potential of the shielding layer 151 is stable, which may also ensure that the potential of the gate lead 141 is stable, avoid the unstable potential of the transparent wire 102 and cause the potential of the gate lead 141 to be unstable, thereby enhancing the stability of the gate potential of the drive transistor M1, enhancing the working stability of the drive transistor M1, and further enhancing the even brightness of the sub-pixels driven by the drive transistor M1.

The DC voltage signal is selected from one of an initialization signal or a DC power signal. Since the initialization signal is transmitted by the initialization signal line VI, the initialization signal line VI may be electrically connected to the metal grid 152, so that the metal grid 152 may transmit a DC voltage signal. Moreover, the initialization signal line VI and the second electrode plate C2 are disposed in the same layer. The DC power signal is transmitted by the DC power signal line VDD, so the DC power signal line VDD may also be electrically connected to the metal grid 152, so that the metal grid 152 transmits the DC voltage signal, allowing the shielding layer 151 to have a fixed voltage.

The display device 100 further comprises a plurality of DC power signal lines VDD. As mentioned above, the plurality of DC power signal lines VDD and the plurality of gate leads 141 are disposed in the same layer, and the metal grid 152 is electrically connected to the plurality of DC power signal lines VDD.

Part of the DC power signal line VDD is disposed in the transition area 100b and corresponding to the plurality of pixel drive circuit islands 101, and is electrically connected to the second pixel drive circuit 1011 of the plurality of pixel drive circuit islands 101. Part of the DC power signal line VDD is disposed in the main display area 100c and is electrically connected to the first pixel drive circuit. The portions of the metal grid 152 corresponding to the plurality of pixel drive circuit islands 101 are disposed corresponding to the plurality of DC power signal lines VDD of the transition area 100b. That is, the portions of the metal grid 152 corresponding to the plurality of pixel drive circuit islands 101 are located directly above the plurality of DC power signal lines VDD of the transition area 100b, so that the wirings transmitting the same signals are correspondingly disposed to avoid electrical signal interference.

Since a drive power of the first pixel drive circuit in the main display area 100c is different from that a drive power of the second pixel drive circuit 1011 of the pixel drive circuit island 101, a width of the DC power signal line VDD in the main display area 100c is greater than a width of the DC power signal of the transition area 100b. When the width of the DC power signal line VDD of the transition area 100b is small, the fourth insulation layer 110 is provided with a via hole 110a on the part of the main display area 100c, and the DC power signal line VDD of the main display area 100c is electrically connected to the metal grid 152 of the main display area 100c through the via hole 110a. Since the metal grid 152 of the main display area 100c is connected to the metal grid 152 of the transition area 100b, the DC power signal line VDD of the transition area 100b is electrically connected to the metal grid 152 of the transition area 100b. When the width of the DC power signal line VDD of the transition area 100b is large, the DC power signal line VDD of the transition area 100b may also be electrically connected to the metal grid 152 of the transition area 100b through a via hole provided on the fourth insulating layer 110 corresponding to the transition area 100b.

Part of the transparent wires 102 extends from the transition area 100b to the light transmission area 100a, and part of the transparent wire 102 is located in the transition area 100b, so that the transparent wire 102 connects the second pixel drive circuit 1011 of the transition area 100b and the second display pixel of the light transmission area 100a.

Figure 7:
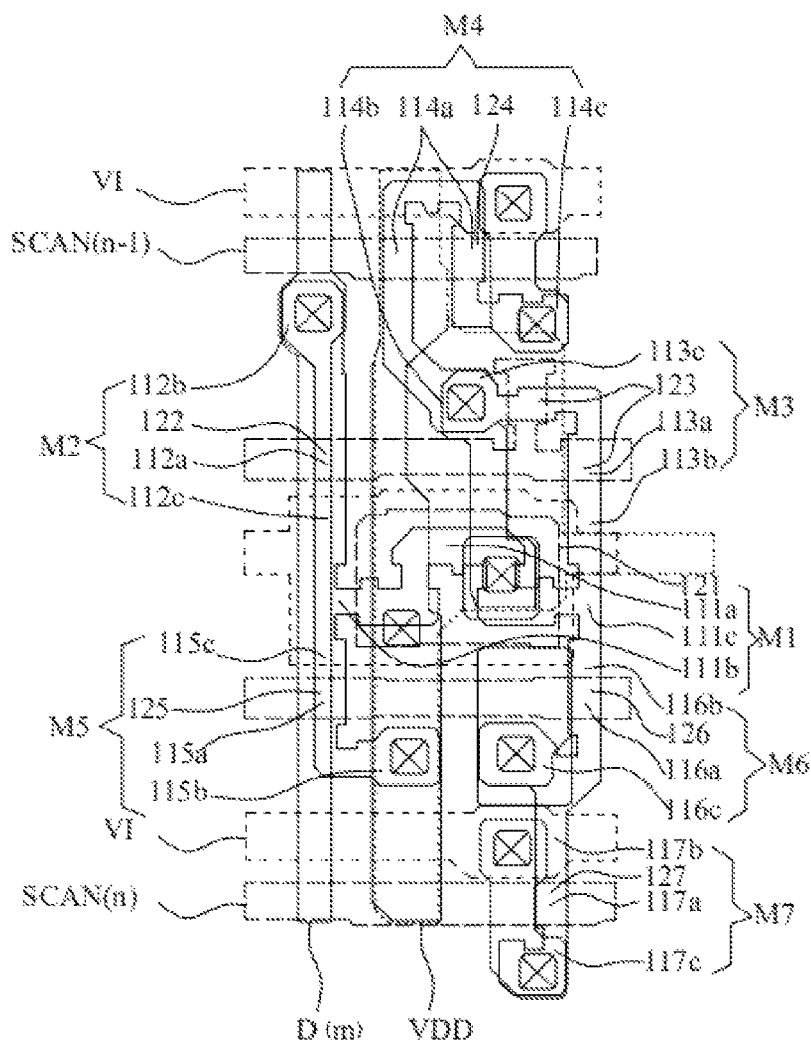
FIG. 7 is a schematic plan view of the second pixel drive circuit and the wires connected to the second pixel drive circuit.
Figure 8:
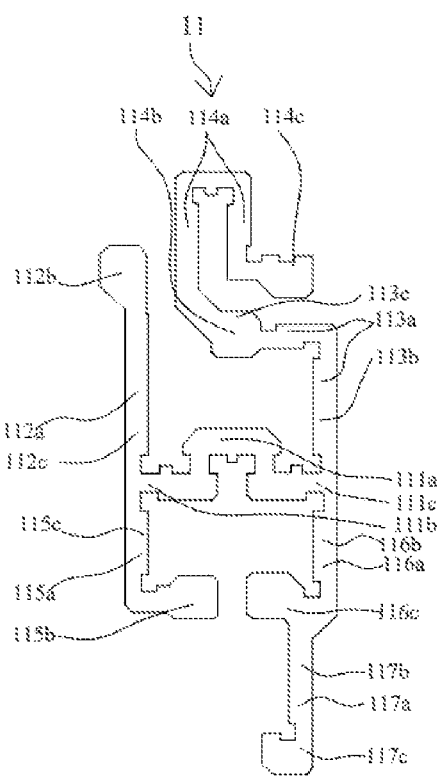
FIG. 8 to FIG. 12 are schematic plan views of a plurality of film layers forming the second pixel drive circuit and the wires connected to the second pixel drive circuit shown in FIG. 7.
Figure 9:
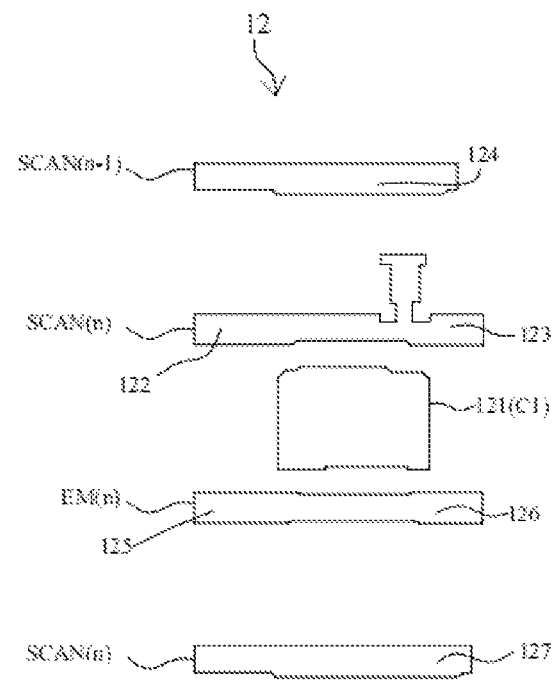
Figure 10:
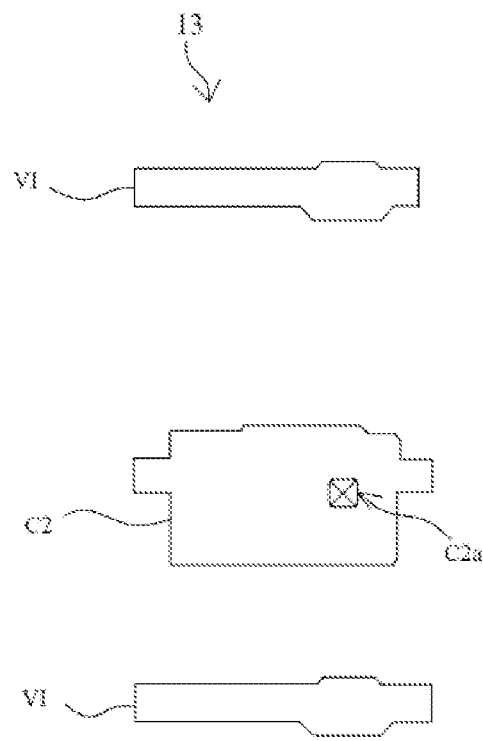
Figure 11:
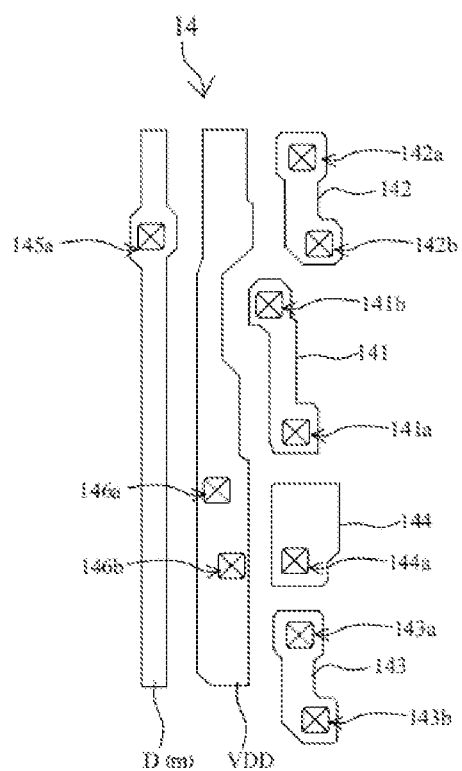
Figure 12:
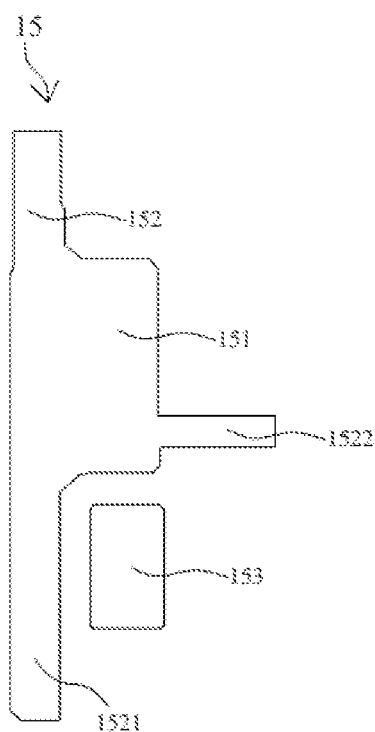

The above solution will be described in detail below in combination with specific embodiments. FIG. 7 is a schematic plan view of the second pixel drive circuit and the wires connected to the second pixel drive circuit, and FIG. 8 to FIG. 12 are schematic plan views of a plurality of film layers forming the second pixel drive circuit and the wires connected to the second pixel drive circuit shown in FIG. 7. FIG. 8 is a patterned semiconductor layer, FIG. 9 is a patterned first metal layer, FIG. 10 is a patterned second metal layer, FIG. 11 is a patterned third metal layer, and FIG. 12 is a patterned fourth metal layer. The first insulation layer 107 described above is disposed between the patterned semiconductor layer shown in FIG. 8 and the patterned first metal layer shown in FIG. 9. The second insulation layer 108 described above is disposed between the patterned first metal layer shown in FIG. 9 and the patterned second metal layer shown in FIG. 10. The third insulation layer 109 described above is disposed between the patterned second metal layer shown in FIG. 10 and the patterned third metal layer shown in FIG. 11. The fourth insulation layer 110 described above is disposed between the third metal layer shown in FIG. 11 and the patterned fourth metal layer shown in FIG. 12.

The wiring connected to the second pixel drive circuit 1011 comprises a data line D(m), an initialization signal line VI, a $n^{th}$ level scan signal line SCAN(n), a n-$1^{th}$ level scan signal line SCAN(n-1), a $n^{th}$ level light emitting control signal line EM(n), and the DC power signal line VDD.

The second pixel drive circuit 1011 comprises a drive transistor M1, a switching transistor M2, a compensation transistor M3, an initialization transistor M4, a first light emitting control transistor M5, a second light emitting control transistor M6, an anode reset transistor M7, and a capacitor.

The patterned semiconductor layer 11 comprises a drive channel 111a of the drive transistor M1, a switching channel 112a of the switching transistor M2, a compensation channel 113a of the compensation transistor M3, an initialization channel 114a of the initialization transistor M4, and a first light emitting control channel 115a of the first light emitting control transistor M5, a second light emitting control channel 116a of the second light emitting control transistor M6, and an anode reset channel 117a of the anode reset transistor M7. The drive channel 111a, the switching channel 112a, the compensation channel 113a, the initialization channel 114a, the first light emitting control channel 115a, the second light emitting control channel 116a, and the anode reset channel 117a are all located in the same layer. The material of the patterned semiconductor layer 11 may be polysilicon. The patterned semiconductor layer 11 further comprises a driving source 111b and a driving drain 111c of the drive transistor M1. The patterned semiconductor layer 11 further comprises a switching source 112b and a switching drain 112c of the switching transistor M2. The patterned semiconductor layer 11 further comprises a compensation source 113b and a compensation drain 113c of the compensation transistor M3. The patterned semiconductor layer 11 further comprises an initialization source 114b and an initialization drain 114c. The patterned semiconductor layer 11 further comprises a first light emitting control source 115b and a first light emitting control drain 115c of the first light emitting control transistor M5. The patterned semiconductor layer 11 further comprises a second light emitting control source 116b and a second light emitting control drain 116c of the second light emitting control transistor M6. The patterned semiconductor layer 11 further comprises an anode reset source 117b and an anode reset drain 117c of the anode reset transistor M7. The source and drain on the patterned semiconductor layer 11 are obtained by doping the active layer to achieve conductivity.

The patterned first metal layer 12 comprises the drive gate 121 of the drive transistor M1. The drive gate 121 of the drive transistor M1 is also the first electrode plate C1 of the capacitor. The switching gate 122 of the switching transistor M2 and the compensation gate 123 of the compensation transistor M3 are both a part of the $n^{th}$ level scan signal line SCAN(n). The compensation gate 124 of the initialization transistor M4 is a part of the n-$1^{th}$ level scan signal line SCAN (n-1). The first light emitting control gate 125 of the first light emitting control transistor M5 and the second emission control gate 126 of the second light emitting control transistor M6 are both a part of the $n^{th}$ level light emitting control signal line EM(n). The anode reset gate 127 of the anode reset transistor M7 is a part of the $n^{th}$ level scan signal line SCAN(n). The n-$1^{th}$ level scan signal line SCAN (n-1), the $n^{th}$ level light emitting control signal line EM(n), the two $n^{th}$ level scanning signal lines SCAN(n), and the drive gate 121 of the drive transistor M1 all belong to the patterned first metal layer 12. The n-$1^{th}$ level scan signal line SCAN(n-1), the $n^{th}$ level light emitting control signal line EM(n), and the $n^{th}$ level scan signal line SCAN(n) are all disposed in parallel to each other, and a shape of the drive gate 121 of the drive transistor M1 is a rectangular shape. The material of the patterned first metal layer 12 comprises at least one of molybdenum, aluminum, titanium, and copper.

The patterned second metal layer 13 comprises two initialization signal lines VI and a second electrode plate C2. The second electrode plate C2 is disposed corresponding to the drive gate 121 of the drive transistor M1, and the drive gate 121 and the second electrode plate C2 form a capacitor. A via hole C2a is disposed on the second electrode plate C2. The material of the patterned second metal layer 13 comprises at least one of molybdenum, aluminum, titanium, and copper.

The patterned third metal layer 14 comprises a gate lead 141, a first initialization lead 142, a second initialization lead 143, a data line D(m), a DC power signal line VDD, and a first anode lead 144. One end of the gate lead 141 is electrically connected to the drive gate 121 of the drive transistor M1 through a first via hole 141 penetrating the third insulation layer 109, the second insulation layer 108, and the second electrode plate C2. The other end of the gate lead 141 is electrically connected to the compensation drain of the compensation transistor M3 through a second via hole 141b penetrating the third insulation layer 109, the first insulation layer 107, and the second insulation layer 108. One end of the first initialization lead 142 is electrically connected to the initialization signal line VI through a third via hole 142a penetrating the third insulation layer 109. The other end of the first initialization lead 142 is electrically connected to the initialization drain 114c of the initialization transistor M4 through a fourth via hole 142b penetrating the third insulation layer 109, the second insulation layer 108, and the first insulation layer 107. One end of the second initialization lead 143 is electrically connected to the initialization signal line VI through a fifth via hole 143a penetrating the third insulation layer 109. The other end of the second initialization lead 143 is electrically connected to the anode reset drain 117c of the anode reset transistor M7 through a sixth via hole 143b penetrating the third insulation layer 109, the second insulation layer 108, and the first insulation layer 107. The first anode lead 144 is electrically connected to the second light emitting control drain 116c of the second light emitting control transistor M6 through a seventh via hole 144a penetrating the third insulation layer 109, the second insulation layer 108, and the first insulation layer 107. The data line D(m) is electrically connected to the switching source 112b of the switching transistor M2 through an eighth via hole 145 penetrating the third insulation layer 109, the second insulation layer 108, and the first insulation layer 107. The DC power signal line VDD is electrically connected to the first light emitting control source 115b of the first light emitting control transistor M5 through a ninth via hole 146b penetrating the third insulation layer 109, the second insulation layer 108, and the first insulation layer 107. The DC power signal line VDD is electrically connected to the second electrode plate C2 through a tenth via hole 146a penetrating the third insulation layer 109, so that the second electrode plate C2 introduces a DC power signal. Material of the patterned third metal layer 14 comprises at least one of molybdenum, aluminum, titanium, and copper. The DC power signal line VDD and the data line D(m) are disposed in parallel, and the data line D(m) perpendicularly intersects the initialization signal line VI and the $n^{th}$ level scan signal line SCAN(n).

The patterned fourth metal layer 15 comprises a metal grid 152, a shielding layer 151, and a second anode lead 153. The metal grid 152 comprises a vertical extension portion 1521 and a horizontal extension portion 1522. The vertical extension portion 1521 and the horizontal extension portion 1522 perpendicularly intersect and form a grid-like metal grid 152. The vertical extension 1521 is disposed corresponding to the DC power signal line VDD, and the horizontal extension 1522 overlaps with the part of the second electrode plate C2, so that the wiring configured to transmit the DC power signal is correspondingly disposed. The second anode lead 153 is disposed directly above the first anode lead 144 and is connected to the first anode lead 144 through a via hole penetrating the fourth insulation layer 110. Moreover, the transparent conductive layer described above is located above the patterned fourth metal layer 15, and the transparent wire 102 is connected between the second anode lead 153 and the anode of the light emitting device OLED. The metal grid 152 may be connected to the DC power signal line VDD through the via hole penetrating the fourth insulation layer 110 to introduce a DC power signal. The material of the patterned fourth metal layer 15 comprises at least one of molybdenum, aluminum, titanium, and copper.

The present disclosure also provides an electronic device. The electronic device comprises the display device described above and a photosensitive unit. The photosensitive unit is disposed corresponding to the light transmission area of the display device. The photosensitive unit is a camera.

The descriptions of the above embodiments are only used to help understand the technical solutions and concepts of the present disclosure. Those of ordinary skill in the art should understand that they can still modify the technical solutions recited in the foregoing embodiments, or some of the technical features can be equally replaced equivalently. These modifications or replacements do not cause the essence of the corresponding technical solutions to deviate from the scope of the technical solutions of the embodiments of the present disclosure.

What is claimed is:

1. A display device with a light transmission area and a transition area located at a periphery of the light transmission area, comprising:
    a plurality of light emitting devices disposed in the light transmission area;
    a plurality of pixel drive circuits disposed in the transition area, wherein each of the pixel drive circuits comprises:
        a drive transistor, wherein the drive transistor comprises a gate; and
        a gate lead disposed above the drive transistor, wherein the gate lead is electrically connected to the gate of the drive transistor;
    at least one transparent conductive layer disposed above the plurality of pixel drive circuits, wherein the at least one transparent conductive layer comprises a plurality of transparent wires, and the plurality of transparent wires are electrically connected to the plurality of light emitting devices and parts of the pixel drive circuits; and
    a shielding layer located between the gate lead and the at least one transparent conductive layer, wherein the shielding layer is disposed corresponding to the gate lead.

2. The display device according to claim 1, wherein in a thickness direction of the display device, an orthographic projection of the gate lead on a substrate of the display device is located inside an orthographic projection of the shielding layer on the substrate of the display device.

3. The display device according to claim 1, wherein the display device further comprises a metal grid configured to transmit a DC voltage signal, the metal grid and the shielding layer are disposed in the same layer and are disposed in the transition area, and the metal grid disposed above the plurality of pixel drive circuits extends out of the shielding layer.

4. The display device according to claim 3, wherein the display device further comprises a plurality of DC power signal lines, and wherein the plurality of DC power signal lines and the gate lead are disposed in a same layer, and the metal grid is electrically connected to the plurality of DC power signal lines.

5. The display device according to claim 4, wherein the display device further comprises a main display region, and the transition display region is located between the main display region and the light transmission display region, and wherein an insulation layer is provided between the plurality of DC power signal lines and the metal grid, a via hole is provided on the insulation layer corresponding to the main display region, and the metal grid is electrically connected to the plurality of DC power signal lines through the via hole.

6. The display device according to claim 3, wherein the DC voltage signal is selected from one of an initialization signal or a DC power signal.

7. The display device according to claim 1, wherein each of the pixel drive circuits further comprises a compensation transistor and an electrode plate, wherein the electrode plate is disposed corresponding to the gate of the drive transistor, and the electrode plate is located between the gate lead and the gate of the drive transistor, and wherein one end of the gate lead is electrically connected to an active layer of the compensation transistor of the pixel drive circuit, and the other end of the gate lead is connected to the gate of the drive transistor at least through a via hole on the electrode plate.

8. The display device according to claim 1, wherein parts of the transparent wires extend from the transition area to the light transmission area, and parts of the transparent wires are located in the transition area.

9. The display device according to claim 1, wherein the display device further comprises a plurality of the transparent conductive layers, and the plurality of transparent wires are located at different ones of the transparent conductive layers.

10. The display device according to claim 1, wherein the plurality of pixel drive circuits form a plurality of pixel drive circuit islands, and wherein a shape of the light transmission area is circular, the plurality of pixel drive circuit islands are disposed around the light transmission area, and at least two of the pixel drive circuit islands have different numbers of the pixel drive circuits.

11. An electronic device, comprising a display device with a light transmission area and a transition area located at a periphery of the light transmission area, and a photosensitive unit, wherein the display device comprises:
    a plurality of light emitting devices disposed in the light transmission area;
    a plurality of pixel drive circuits disposed in the transition area, wherein each of the pixel drive circuits comprises:
    a drive transistor, wherein the drive transistor comprises a gate; and
    a gate lead disposed above the drive transistor, wherein the gate lead is electrically connected to the gate of the drive transistor;
    at least one transparent conductive layer disposed above the plurality of pixel drive circuits, wherein the at least one transparent conductive layer comprises a plurality of transparent wires, and the plurality of transparent wires are electrically connected to the plurality of light emitting devices and parts of the pixel drive circuits; and
    a shielding layer located between the gate lead and the at least one transparent conductive layer, wherein the shielding layer is disposed corresponding to the gate lead, and
    wherein the photosensitive unit is disposed corresponding to the light transmission display region of the display device.

12. The electronic device according to claim 11 wherein in a thickness direction of the display device, an orthographic projection of the gate lead on a substrate of the display device is located inside an orthographic projection of the shielding layer on the substrate of the display device.

13. The electronic device according to claim 11, wherein the display device further comprises a metal grid configured to transmit a DC voltage signal, the metal grid and the shielding layer are disposed in the same layer and are disposed in the transition area, and the metal grid disposed above the plurality of pixel drive circuits extends out of the shielding layer.

14. The electronic device according to claim 13, wherein the display device further comprises a plurality of DC power signal lines, and wherein the plurality of DC power signal lines and the gate lead are disposed in the same layer, and the metal grid is electrically connected to the plurality of DC power signal lines.

15. The electronic device according to claim 14, wherein the display device further comprises a main display area, and the transition area is located between the main display area and the light transmission area, and wherein an insulation layer is provided between the plurality of DC power signal lines and the metal grid, a via hole is provided on the insulation layer corresponding to the main display area, and the metal grid is electrically connected to the plurality of DC power signal lines through the via.

16. The electronic device according to claim 13, wherein the DC voltage signal is selected from one of an initialization signal or a DC power signal.

17. The electronic device according to claim 11, wherein each of the pixel drive circuits further comprises a compensation transistor and an electrode plate, wherein the electrode plate is disposed corresponding to the gate of the drive transistor, and the electrode plate is located between the gate lead and the gate of the drive transistor, and wherein one end of the gate lead is electrically connected to an active layer of the compensation transistor of the pixel drive circuit, and the other end of the gate lead is connected to the gate of the drive transistor at least through the via hole on the electrode plate.

18. The electronic device according to claim 11, wherein parts of the transparent wires extend from the transition area to the light transmission area, and parts of the transparent wires are located in the transition area.

19. The electronic device according to claim 11, wherein the display device further comprises a plurality of the transparent conductive layers, and the plurality of transparent wires are located at different ones of the transparent conductive layers.

20. The electronic device according to claim 11, wherein the plurality of pixel drive circuits form a plurality of pixel drive circuit islands, and wherein a shape of the light transmission area is circular, the plurality of pixel drive circuit islands are disposed around the light transmission area, and at least of the two pixel drive circuit islands have different numbers of the pixel drive circuits.

* * * * *